United States Patent [19]

Crewe

[11] 4,414,474
[45] Nov. 8, 1983

[54] CORRECTOR FOR AXIAL ABERRATIONS IN ELECTRON OPTIC INSTRUMENTS

[75] Inventor: Albert V. Crewe, Palos Park, Ill.

[73] Assignee: University Patents, Inc., Norwalk, Conn.

[21] Appl. No.: 349,442

[22] Filed: Feb. 17, 1982

[51] Int. Cl.³ .................. H01J 3/12; H01J 37/153
[52] U.S. Cl. .................. 250/396 R; 250/396 ML; 250/311
[58] Field of Search ............ 250/396 R, 396 ML, 311

[56] References Cited

U.S. PATENT DOCUMENTS 3,952,198  4/1976  Harada et al. ............... 250/396 ML
4,303,864  12/1981  Crewe et al. ................... 250/396 R

OTHER PUBLICATIONS

Hitachi Advertisement, *Science*, Jun. 10, 1983, vol. 220, No. 4602, p. 1112.

*Primary Examiner*—Alfred E. Smith
*Assistant Examiner*—Jack I. Berman
*Attorney, Agent, or Firm*—Philip Hill

[57] ABSTRACT

Means for compensating for third and higher order aberrations in an electron optic system comprises two sextupoles and a field lens, the latter being spaced intermediate the sextupoles. The resolving power of the optic system can be reduced to the range of about 0.5 Angstrom unit.

6 Claims, 4 Drawing Figures

Multipole 1        Lens        Multipole 2

Multipole 1   Lens   Multipole 2

Sextupole 11   Field Lens 13   Sextupole 12   Objective Lens 14

CORRECTOR FOR AXIAL ABERRATIONS IN ELECTRON OPTIC INSTRUMENTS

BACKGROUND OF THE INVENTION

This invention relates to a corrector system for inclusion in an electron optic instrument, particularly a scanning transmission electron microscope, for minimizing odd-order aberrations and thus obtaining greatly improved resolving power.

The history of electron microscopy has been one of searching for methods for achieving higher and higher resolving powers. The upper limit would be the wavelength of the electrons themselves, and consequently probably not attainable. The next nearest goal would be the capability of directly imaging the atoms in a solid. Since the distances involved are of the order of 1–2 Angstrom units and it is necessary to image a projection of the atoms on to a plane, a resolution of 1 Angstrom unit or less would be highly desirable. This goal is beyond the reach of existing microscopes.

The primary reason for the inability to achieve such a resolution is the existence of large lens aberrations, particularly the spherical, or aperture, aberration. Using optimum conditions, the best resolution that can now be obtained is about 2–3 Angstrom units, a value which approximates what is needed but is not small enough to allow direct imaging.

The most commonly employed indirect technique used in conventional microscopes takes advantage of various indirect imaging methods. These usually employ an accurately aligned crystal and are based upon the repetitive nature of the arrangement of the atoms. By carefully controlling the amount of defocus and the many other parameters of the microscope an image can be obtained which represents the atomic positions. Such images need careful interpretation, however, since the image details change drastically with defocus, specimen thickness, voltage, and the like. Such "interferograms" have been used to image lattice spacings below the 1 Angstrom unit level, using microscopes whose nominal resolution for amorphous detail would be no more than 2–3 Angstrom units. Other related techniques involve taking a focal series of a multilayer specimen and comparing the images with computer simulations. The practical limit for this technique appears to have been reached with the proposed installation of a one-million volt microscope, which is designed to have a resolution of about 1.8 Angstrom unit and should be capable of lattice resolution below the 1 Angstrom unit level. This is still far away from the ideal goal of imaging atoms in an "amorphous" specimen in an unambiguous manner with a point resolving power below 1 Angstrom unit.

The difficulties involved in the correction of spherical aberration can easily be inferred from the history of events. It has been demonstrated theoretically that all cylindrically symmetric lenses have the same sign of spherical aberration. By implication then, the spherical aberration could not be made zero, and the only hope of eliminating it would be to build a separate correcting device which could not by cylindrically symmetric.

There was later demonstrated the possibility of a correction device, consisting of four quadrupoles and three octupoles for a total of 40 pole pieces. The effect was successfully demonstrated with such a device although not on a scale sufficiently small to be suitable for microscopy. Scaling these large systems down for an electron microscope would be difficult because theoretical investigations indicated a mechanical tolerance of about 0.1 micron for each of the 40 pole pieces. All attempts to construct such a device have failed.

There remains a need for significant improvement in electron optic instrumentation systems to afford a degree of resolution sufficient to permit direct imaging of atoms in solids, whether crystalline or amorphous.

SUMMARY OF THE INVENTION

This invention relates to the incorporation into an electron optic system using symmetric lenses, e.g. a scanning transmission electron microscope (STEM), of a device for correction of the spherical aberration of the objective lens, employed in a novel manner whereby the resolving power can be reduced to the level of about 0.5 Angstrom unit. The device of this invention, for correcting third order spherical aberrations, comprises two spaced sextupole units and one magnetic lens, the lens being positioned intermediate the sextupoles so that each sextupole is imaged on the other.

It is an object of this invention to provide a device constructed as to afford its ready insertion into existing electron microscope (STEM) units or to afford its incorporation directly into the optical system of a newly constructed microscope unit. Whenever an electron beam is directed toward the center of the magnetic lens, the system introduces a spherical aberration of opposite sign to that of the magnetic lens and thus can be employed to achieve an electron optic system with essentially zero spherical aberration. A preferred sextupole length is within the range from about 0.07 to about 0.1 the distance between the spaced sextupoles.

Another object of this invention is to permit the use of lenses having somewhat greater focal lengths; for example, from about 3 to about 10 mm.

In an extension of this invention decapoles may also be incorporated into the device to correct similarly for fifth-order aberrations.

DESCRIPTION OF THE DRAWINGS

The attached drawings are illustrative, without limitation, of pertinent features of this invention.

DESCRIPTION OF THE INVENTION

This invention relates to an electron optic system, having a source of electrons, improved for correction of particularly third-order aberrations such that the point resolving power is reduced to less than 1.0 Angstrom unit and, indeed, many approach about 0.5 Angstrom unit. The improvement of this invention comprises aligned first and second spaced sextupole means together with a magnetic field lens means, disposed intermediate the respective sextupole means so that the two latter means are imaged on each other. All of the sextupole and lens means are interposed between first and second conventional condenser lens means. The improvement of this invention may be fashioned as a unit for insertion into existing scanning transmission electron microscopes (STEM) or may be incorporated directly into the intended beam path of newly constructed units.

The corrector system of this invention may be employed in any STEM without regard for the particular voltage level. Voltage levels of from about 150 to 200 kilovolts are especially satisfactory.

It has been found that an incoming electron beam, or ray, may be corrected for aberrations by being brought to a focus between two sextupoles and at the center of a field lens. In a preferred embodiment of this invention sextupoles of equal excitation are employed such that the field lens may be located midway between the sextupoles. The focal length of the field lens is selected to be one-quarter of the distance between the two sextupoles so that it images one sextupole on the other. As to first order, the system has no effect. As to second order, the lens changes the sign of the slope aberration and the second sextupole cancels the effect of the first. As to third order, the lens likewise changes the sign of the slope aberration but the second sextupole reinforces the effect of the first. In this configuration, all even order aberrations are cancelled and all odd orders are reinforced. The net effect is that the system of this invention introduces a spherical aberration at the beam crossover, a determinable slope defect which is cylindrically symmetric.

Figure 1:
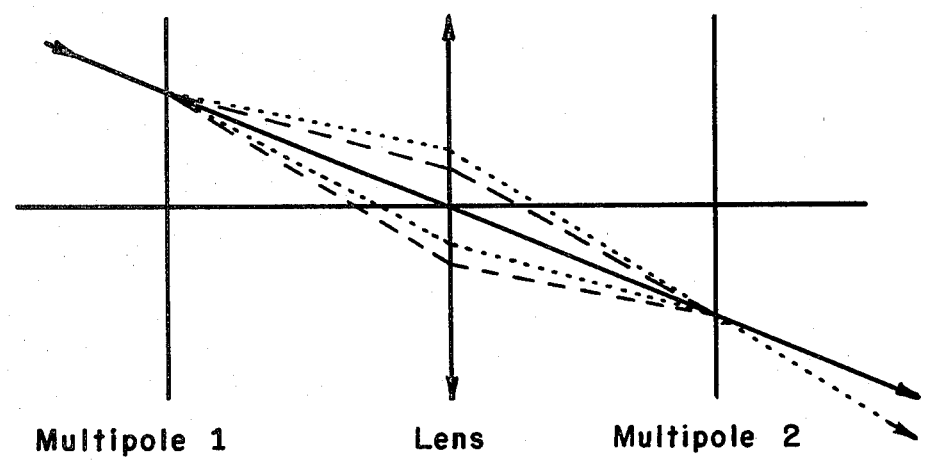
FIG. 1 serves to illustrate the action of the sextupoles and lens in eliminating even-order aberrations.

FIG. 1 serves to illustrate the use of multipole (sextupole) elements to correct spherical aberration. The first-order trajectories (solid lines) are not affected. The second-order effects of the first sextupole (dashed lines) are cancelled by the second sextupole. The third-order effects (dotted lines) are enhanced. Two sets of rays are shown for two arbitrary planes.

Figure 2:
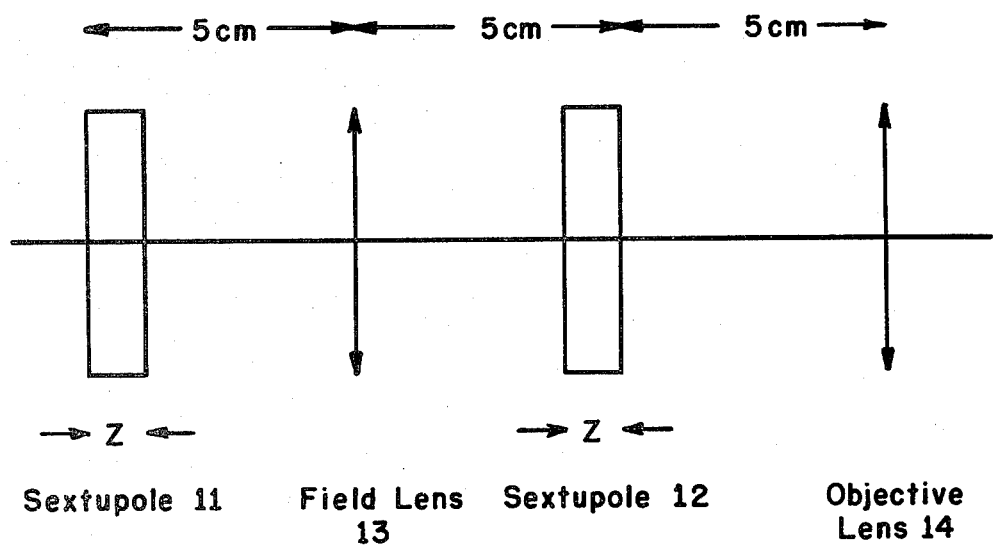
FIG. 2 presents a line drawing illustrative of one possible geometrical configuration.

In the arrangement illustrated in FIG. 2, the beam of electrons is focused at the center of field lens 13, disposed symmetrically between sextupole 11 and sextupole 12, by means of an auxiliary lens (not shown). From the dimensions shown, the length (Z) of each sextupole is seen to be approximately 1 cm., or about 0.1 of the distance between the sextupoles. Objective lens 14 is situated an additional unit of length (5 cm.) downstream.

If the length of the sextupole (Z) is assumed to be 1 cm., the gap between sextupoles and field lens (5-Z) is 4 cm., and the gap between the second sextupole and the objective lens is 5 cm., the parameters of the final image, formed by the objective lens, may be calculated. Although there are small deviations from cylindrical symmetry, such deviations do not exceed 0.5 Angstrom unit. When Z is set at 0.5 cm., asymmetry becomes undetectable. Accordingly, the length of the respective sextupoles should be selected within the range from 0.05 to 0.10, preferably from 0.07 to 0.10, the distance spacing between the sextupoles.

When operating in the range of about 200 kilovolts, the range of focal lengths available for the objective lens is greatly enhanced, permitting values generally within the range from about 3 to about 5 mm., and even as high as 10 mm.

Figure 3:
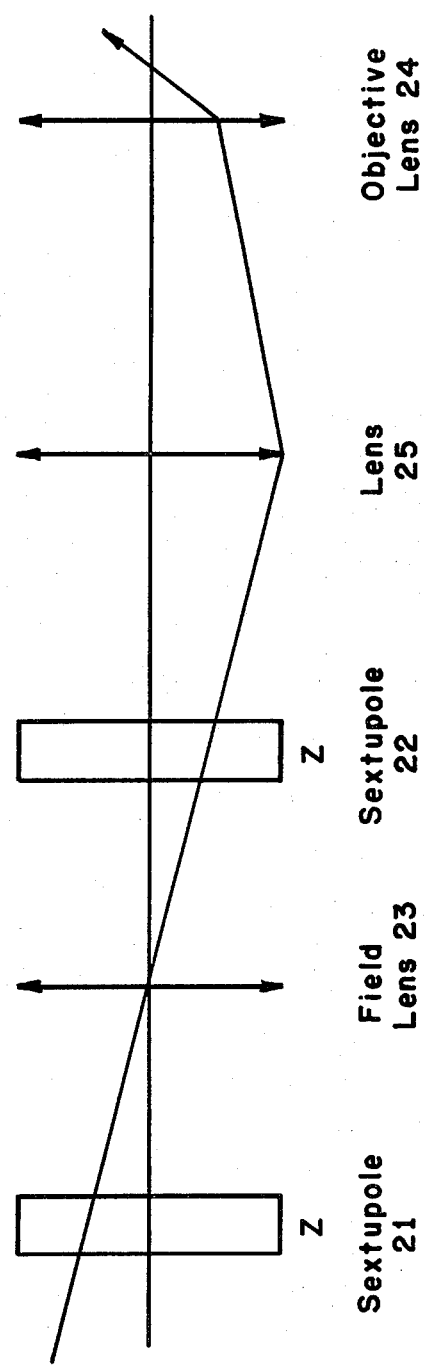
FIG. 3 presents another line drawing illustrative of a desirable configuration.

FIG. 3 presents a modified arrangement which may be employed in order to reduce the strength of the sextupole. As before, the field lens 23 is interposed between respective sextupoles 21 and 22. The modification comprises the inclusion of additional lens 25 which serves to reduce the beam diameter prior to its entry into objective lens 24.

Figure 4:
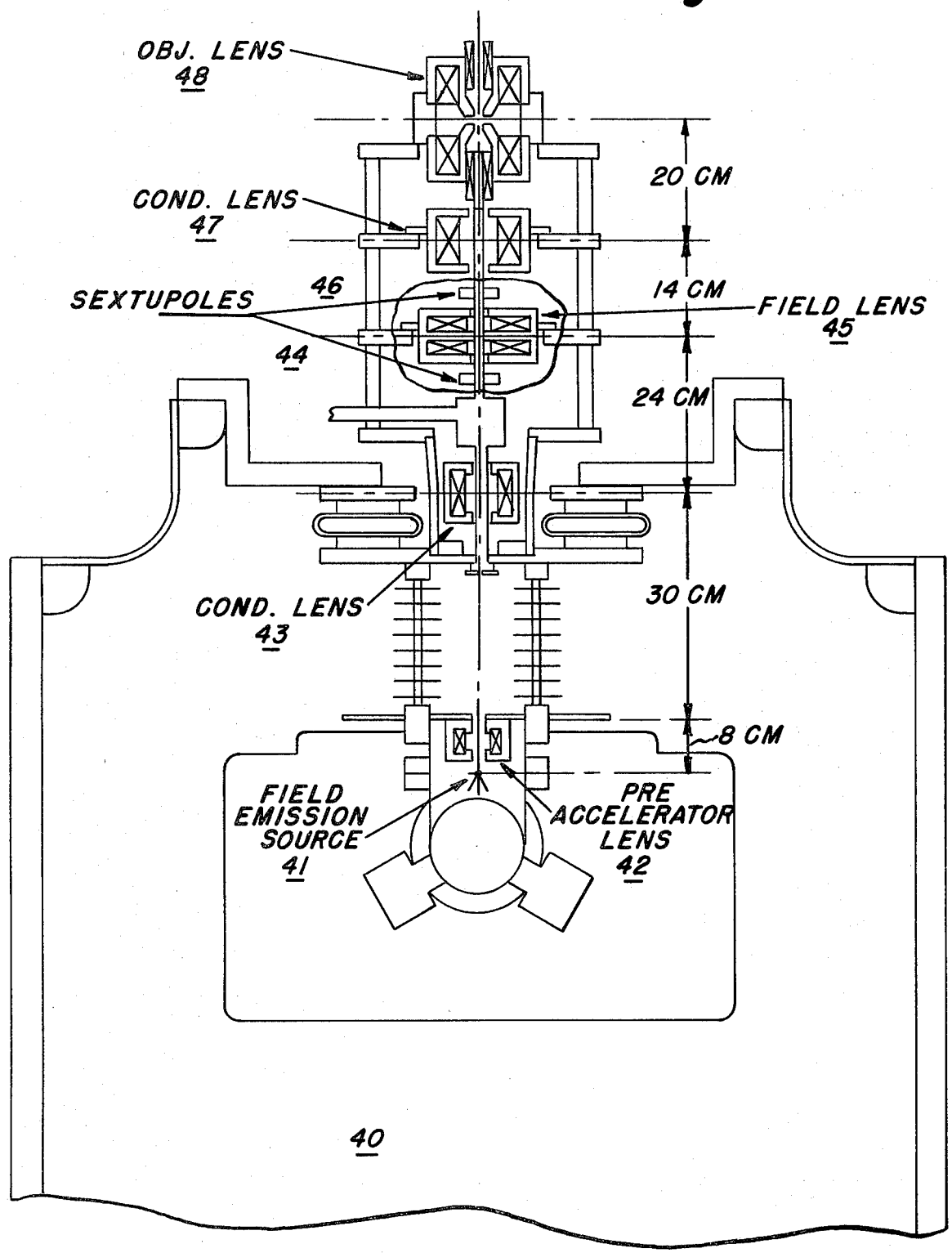
FIG. 4 presents a schematic view of a preferred embodiment of the corrector device of this invention, as incorporated into an electron microscope (STEM).

A preferred embodiment of this invention is shown in FIG. 4, together with its spatial relationship to the conventional sections of a typical STEM. An electron beam is generated in pressure vessel 40 at field emmission source 41, employing a 200 kv. power supply, not shown. The beam is sent through pre-accelerator lens 42 and condenser lens 43, which may be situated outside the pressurized zone. The beam then is passed through the corrector system of this invention, enclosed within the dotted line and comprising sextupoles 44 and 46 together with field lens 45. The corrected beam is then passed downstream through condensing lens 47, and finally through objective lens 48. The total distance from field emission source 41 to the center plane of objective lens 48 is represented as 96 cm.

The corrector device of this invention affords a relatively inexpensive system for the extensive improvement of the resolution achieveable with STEM. Still further improvement is similarly available by correction of fifth-order aberrations, additionally employing in a similar manner spaced, aligned decapoles, adjacent the sextupoles and preferably superposed upon the sextupoles.

The correction system of this invention, with reversal of all rays, should be equally applicable to a conventional electron microscope (CTEM).

I claim:

1. In an electron optic system, having a source of electrons, the improvement in the system for correction of third-order aberrations such that the point resolving power is reduced to less than 1.0 Angstrom unit, comprising: aligned first and second spaced sextupole means and an intermediately disposed magnetic field lens means, all interposed between first and second conventional condenser lens means, such that the respective sextupole means are imaged on each other.

2. The system of claim 1, for additional correction of fifth-order aberrations, wherein decapole means are disposed adjacent the respective sextupole means, such that the respective decapole means are imaged on each other.

3. The system of claim 1 wherein the optic system comprises a scanning transmission electron microscope having an electron source with a voltage greater than about 150 kolovolts.

4. The system of claim 1 wherein the length of each of the respective sextupole means is within the range from about 0.05 to about 0.1 of the distance therebetween.

5. The system of claim 4 wherein the length of each of the respective sextupole means is within the range from about 0.07 to about 0.1 of the distance therebetween.

6. The system of claim 1, having an objective lens whose focal length is within the range from about 3 to about 10 mm.

* * * * *